(12) United States Patent
May et al.

(10) Patent No.: US 6,965,334 B2
(45) Date of Patent: Nov. 15, 2005

(54) VARIABLE BANDGAP REFERENCE

(75) Inventors: Marcus W. May, Austin, TX (US); John Willis, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 10/944,510

(22) Filed: Sep. 17, 2004

(65) Prior Publication Data

US 2005/0030213 A1 Feb. 10, 2005

Related U.S. Application Data

(63) Continuation of application No. 10/603,545, filed on Jun. 25, 2003, now Pat. No. 6,859,156.

(60) Provisional application No. 60/429,941, filed on Nov. 29, 2002.

(51) Int. Cl.[7] ............................. H03M 1/66; G05F 1/10
(52) U.S. Cl. ........................ 341/144; 327/536; 323/315
(58) Field of Search ......................... 341/144; 327/535, 327/536, 537, 538, 539, 540, 541, 542, 543; 323/314, 315, 316

(56) References Cited

U.S. PATENT DOCUMENTS

| | | | | |
|---|---|---|---|---|
| 5,589,762 A | * | 12/1996 | Iannuzo | 323/351 |
| 5,966,039 A | * | 10/1999 | Koglin et al. | 327/356 |
| 6,239,652 B1 | * | 5/2001 | Oh et al. | 327/541 |
| 6,583,661 B1 | * | 6/2003 | Tanji et al. | 327/355 |
| 2003/0001632 A1 | * | 1/2003 | Anderson et al. | 327/112 |
| 2003/189443 A1 | * | 10/2003 | Kunz et al. | 326/81 |
| 2004/0027192 A1 | * | 2/2004 | Fratti et al. | 327/540 |

* cited by examiner

*Primary Examiner*—Howard L. Williams
(74) *Attorney, Agent, or Firm*—Garlick, Harrison & Markison LLP; Timothy W. Markison

(57) ABSTRACT

A variable bandgap reference includes a fixed bandgap reference source and a supply voltage dependent voltage divider module. The fixed bandgap produces a fixed reference voltage. The supply voltage dependent voltage adjust module adjusts the fixed reference voltage to produce the reference voltage.

4 Claims, 6 Drawing Sheets multi-function handheld device 40 integrated circuit 12-2 integrated circuit 12-3

DAC 72 op amp 150

VARIABLE BANDGAP REFERENCE

This patent is claiming priority under 35 USC §120 as a continuing patent application of patent application entitled VARIABLE BANDGAP REFERENCE AND APPLICATIONS THEREOF, having a Ser. No. 10/603,545, and a filing date of Jun. 25, 2004, now U.S. Pat. No. 6,859,156 which claimed priority under 35 USC § 119(e) to provisionally filed patent application entitled MULTI-FUNCTION HANDHELD DEVICE, having a provisional Ser. No. 60/429,941 and a provisional filing date of Nov. 29, 2002.

BACKGROUND OF THE INVENTION

1. Technical Field of the Invention

This invention relates generally to portable electronic equipment and more particularly to powering such equipment from low voltage supplies.

2. Description of Related Art

As is known, integrated circuits are used in a wide variety of electronic equipment, including portable, or handheld, devices. Such handheld devices include personal digital assistants (PDA), CD players, MP3 players, DVD players, AM/FM radio, a pager, cellular telephones, computer memory extension (commonly referred to as a thumb drive), etc. Each of these handheld devices includes one or more integrated circuits to provide the functionality of the device. For example, a thumb drive may include an integrated circuit for interfacing with a computer (e.g., personal computer, laptop, server, workstation, etc.) via one of the ports of the computer (e.g., Universal Serial Bus, parallel port, etc.) and at least one other memory integrated circuit (e.g., flash memory). As such, when the thumb drive is coupled to a computer, data can be read from and written to the memory of the thumb drive. Accordingly, a user may store personalized information (e.g., presentations, Internet access account information, etc.) on his/her thumb drive and use any computer to access the information.

As another example, an MP3 player may include multiple integrated circuits to support the storage and playback of digitally formatted audio (i.e., formatted in accordance with the MP3 specification). As is known, one integrated circuit may be used for interfacing with a computer, another integrated circuit for generating a power supply voltage, another for processing the storage and/or playback of the digitally formatted audio data, and still another for rendering the playback of the digitally formatted audio data audible.

Integrated circuits (IC) have enabled the creation of a plethora of handheld devices, however, to be "wired" in today's electronic world, a person needs to possess multiple handheld devices. For example, one may own a cellular telephone for cellular telephone service, a PDA for scheduling, address book, etc., one or more thumb drives for extended memory functionality, an MP3 player for storage and/or playback of digitally recorded music, a radio, etc. Thus, even though a single handheld device may be relatively small, carrying multiple handheld devices on one's person can become quite burdensome.

As integrated circuit technologies evolve, integrated circuit density (i.e., more transistors in smaller die area) is increasing and the supply voltage requirements are decreasing. For example, 0.18 micron CMOS technology has a supply voltage requirement of approximately 1.8 volts. The supply voltage requirements for 0.13 micron and 0.10 micron CMOS technology is even less. With such low supply voltages, standard IC circuits, such as bandgap references, may not operate properly and/or may provide a reference voltage that is too high. For instance, with a supply voltage of 1.8 volts, a desired common mode AC ground for differential signaling would be 0.9 volts. Thus, it would be desirable to have a reference voltage of 0.9 volts as opposed to the traditional 1.2 volts for differential signaling IC circuits such as digital to analog converters, analog to digital converters, operational amplifiers, etc.

Therefore, a need exists for an adjustable bandgap reference to provide an adjustable reference voltage for various low voltage IC circuits.

BRIEF SUMMARY OF THE INVENTION

The variable bandgap reference of the present invention substantially meets these needs and others. In one embodiment, a variable bandgap reference includes a fixed bandgap reference source and a supply voltage dependent voltage adjust module. The fixed bandgap produces a fixed reference voltage (e.g., 1.2 volts). The supply voltage dependent voltage adjust module adjusts the fixed reference voltage to produce the reference voltage (e.g., a reference voltage less than or equal to 1.2 volts or a reference voltage greater than 1.2 volts).

In another embodiment, an adjustable low voltage digital to analog converter includes a digital to analog converter and a variable bandgap module. The digital to analog converter module is operably coupled to convert a digital signal into an analog signal based on a reference voltage. The variable bandgap module includes a fixed bandgap reference and a supply voltage dependent voltage adjust module. The fixed bandgap produces a fixed reference voltage (e.g., 1.2 volts). The supply voltage dependent voltage adjust module adjusts the fixed reference voltage to produce the reference voltage (e.g., a reference voltage less than or equal to 1.2 volts or a reference voltage greater than 1.2 volts).

DETAILED DESCRIPTION OF THE INVENTION

Figure 1:
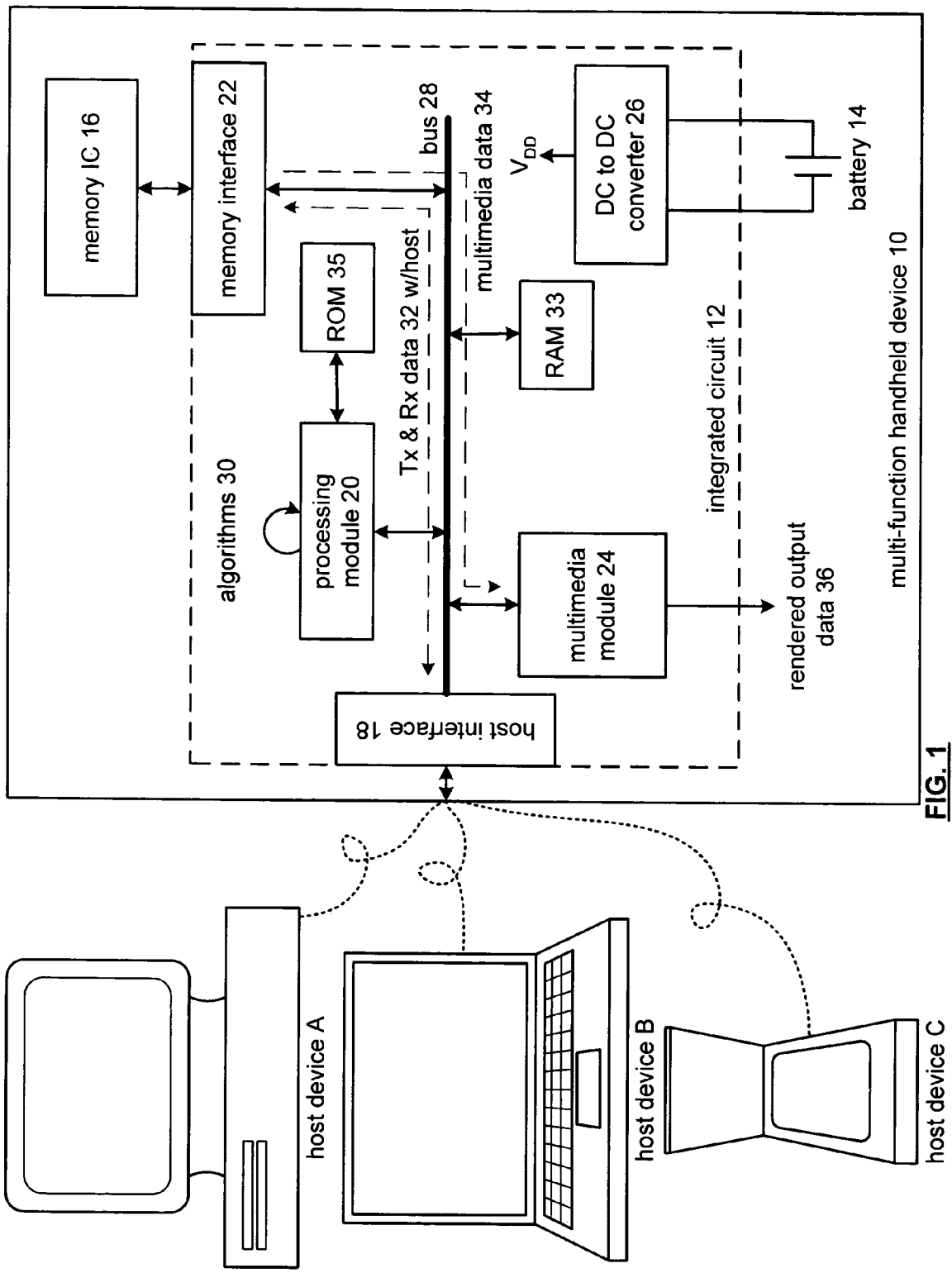
FIG. 1 is a schematic block diagram of a handheld device and corresponding integrated circuit in accordance with the present invention.

FIG. 1 is a schematic block diagram of a multi-function handheld device 10 and corresponding integrated circuit 12 operably coupled to a host device A, B, or C. The multi-function handheld device 10 also includes memory integrated circuit (IC) 16 and a battery 14. The integrated circuit 12 includes a host interface 18, a processing module 20, a memory interface 22, a multimedia module 24, a DC-to-DC converter 26, and a bus 28. The multimedia module 24 alone or in combination with the processing module 20 provides the functional circuitry for the integrated circuit 12. The DC-to-DC converter 26, which may be constructed in accordance with the teaching of U.S. Pat. No. 6,204,651, entitled METHOD AND APPARATUS FOR REGULATING A DC VOLTAGE, provides at least a first supply voltage to one or more of the host interface 18, the processing module 20, the multimedia module 24, and the memory interface 22. The DC-to-DC converter 26 may also provide $V_{DD}$ to one or more of the other components of the handheld device 10.

When the multi-function handheld device 10 is operably coupled to a host device A, B, or C, which may be a personal computer, workstation, server (which are represented by host device A), a laptop computer (host device B), a personal digital assistant (host device C), and/or any other device that may transceive data with the multi-function handheld device, the processing module 20 performs at least one algorithm 30 where the corresponding operational instructions of the algorithm 30 are stored in memory 16 and/or in memory incorporated in the processing module 20. The processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

With the multi-function handheld device 10 in the first functional mode, the integrated circuit 12 facilitates the transfer of data between the host device A, B, or C and memory 16, which may be non-volatile memory (e.g., flash memory, disk memory, SDRAM) and/or volatile memory (e.g., DRAM). In one embodiment, the memory IC 16 is a NAND flash memory that stores both data and the operational instructions of at least some of the algorithms 30.

In this mode, the processing module 30 retrieves a first set of operational instructions (e.g., a file system algorithm, which is known in the art) from the memory 16 to coordinate the transfer of data. For example, data received from the host device A, B, or C (e.g., Rx data) is first received via the host interface module 18. Depending on the type of coupling between the host device and the handheld device 10, the received data will be formatted in a particular manner. For example, if the handheld device 10 is coupled to the host device via a USB cable, the received data will be in accordance with the format proscribed by the USB specification. The host interface module 18 converts the format of the received data (e.g., USB format) into a desired format by removing overhead data that corresponds to the format of the received data and storing the remaining data as data words. The size of the data words generally corresponds directly to, or a multiple of, the bus width of bus 28 and the word line size (i.e., the size of data stored in a line of memory) of memory 16. Under the control of the processing module 20, the data words are provided, via the memory interface 22, to memory 16 for storage. In this mode, the handheld device 10 is functioning as extended memory of the host device (e.g., like a thumb drive).

In furtherance of the first functional mode, the host device may retrieve data (e.g., Tx data) from memory 16 as if the memory were part of the computer. Accordingly, the host device provides a read command to the handheld device, which is received via the host interface 18. The host interface 18 converts the read request into a generic format and provides the request to the processing module 20. The processing module 20 interprets the read request and coordinates the retrieval of the requested data from memory 16 via the memory interface 22. The retrieved data (e.g., Tx data) is provided to the host interface 18, which converts the format of the retrieved data from the generic format of the handheld device into the format of the coupling between the handheld device and the host device. The host interface 18 then provides the formatted data to the host device via the coupling.

The coupling between the host device and the handheld device may be a wireless connection or a wired connection. For instance, a wireless connection may be in accordance with Bluetooth, IEEE 802.11(a), (b) or (g), and/or any other wireless LAN (local area network) protocol, IrDA, etc. The wired connection may be in accordance with one or more Ethernet protocols, Firewire, USB, etc. Depending on the particular type of connection, the host interface module 18 includes a corresponding encoder and decoder. For example, when the handheld device 10 is coupled to the host device via a USB cable, the host interface module 18 includes a USB encoder and a USB decoder.

As one of average skill in the art will appreciate, the data stored in memory 16, which may have 64 Mbytes or greater of storage capacity, may be text files, presentation files, user profile information for access to varies computer services (e.g., Internet access, email, etc.), digital audio files (e.g., MP3 files, WMA—Windows Media Architecture-, MP3 PRO, Ogg Vorbis, AAC—Advanced Audio Coding), digital video files [e.g., still images or motion video such as MPEG (motion picture expert group) files, JPEG (joint photographic expert group) files, etc.], address book information, and/or any other type of information that may be stored in a digital format. As one of average skill in the art will further appreciate, when the handheld device 10 is coupled to the host device A, B, or C, the host device may power the handheld device 10 such that the battery is unused.

When the handheld device 10 is not coupled to the host device, the processing module 20 executes an algorithm 30 to detect the disconnection and to place the handheld device in a second operational mode. In the second operational mode, the processing module 20 retrieves, and subsequently executes, a second set of operational instructions from memory 16 to support the second operational mode. For example, the second operational mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In the second operational mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, the multimedia module 24 converts the data 34 into rendered output data 36. For example, the multimedia module 24 may convert digitized data into analog signals that are subsequently rendered audible via a speaker or via a headphone jack. In addition, or in the alternative, the multimedia module 24 may render digital video data and/or digital text data into RGB (red-green-blue), YUV, etc., data for display on an LCD (liquid crystal display) monitor, projection CRT, and/or on a plasma type display. The multimedia module 24 will be described in greater detail with reference to FIGS. 2 and 3.

As one of average skill in the art, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 2:
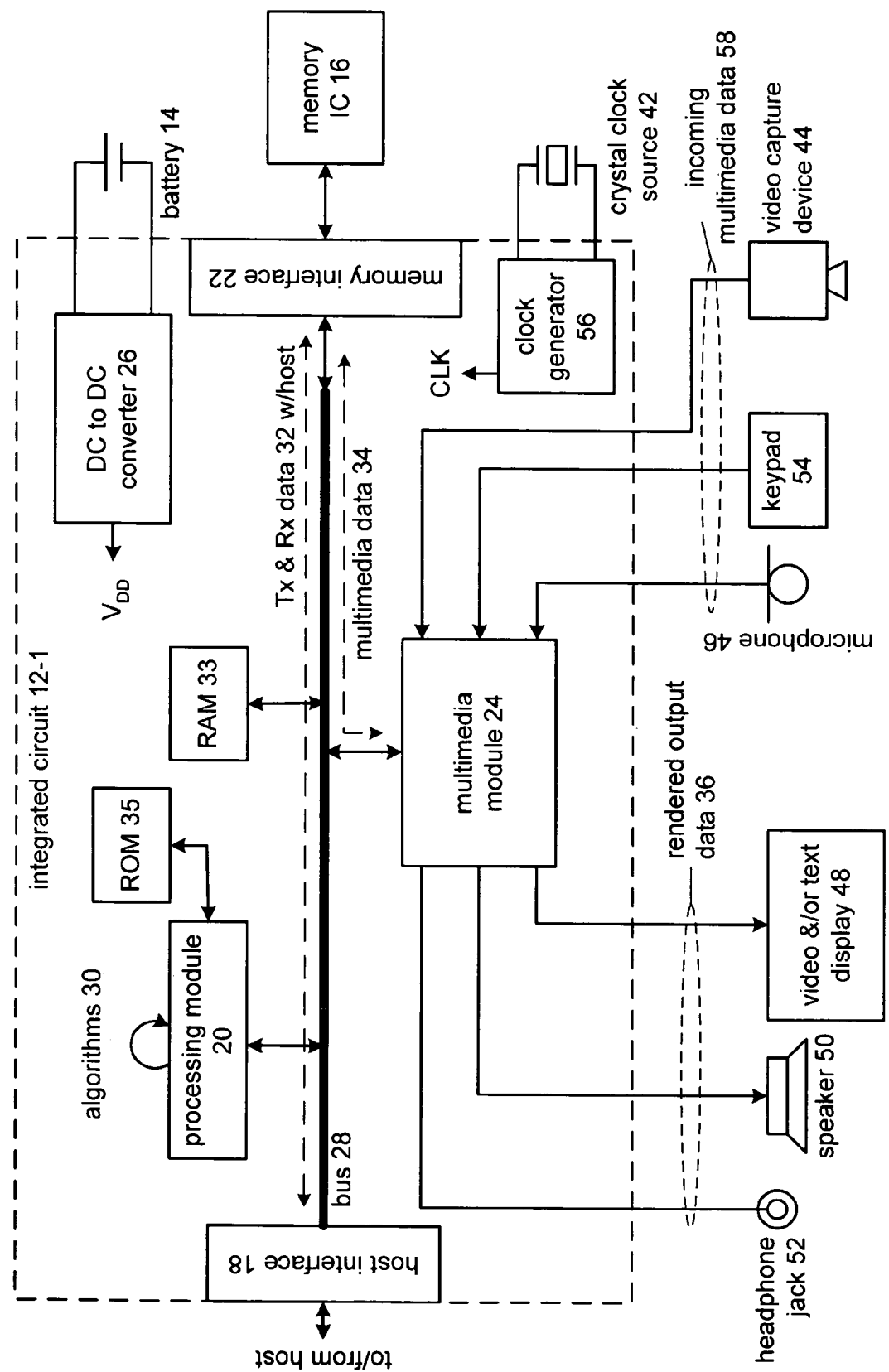
FIG. 2 is a schematic block diagram of another handheld device and corresponding integrated circuit in accordance with the present invention.

FIG. 2 is a schematic block diagram of another handheld device 40 and a corresponding integrated circuit 12-1. In this embodiment, the handheld device 40 includes the integrated circuit 12-1, the battery 14, the memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The integrated circuit 12-1 includes the host interface 18, the processing module 20, the memory interface 22, the multimedia module 24, the DC-to-DC converter 26, and a clock generator 56, which produces a clock signal (CLK) for use by the other modules. As one of average skill in the art will appreciate, the clock signal CLK may include multiple synchronized clock signals at varying rates for the various operations of the multi-function handheld device.

Handheld device 40 functions in a similar manner as handheld device 10 when exchanging data with the host device (i.e., when the handheld device is in the first operational mode). In addition, while in the first operational mode, the handheld device 40 may store digital information received via one of the multimedia input devices 44, 46, and 54. For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this extension of the first operational mode, the processing module 20 arbitrates write access to the memory 16 among the various input sources (e.g., the host and the multimedia module).

When the handheld device 40 is in the second operational mode (i.e., not connected to the host), the handheld device may record and/or playback multimedia data stored in the memory 16. Note that the data provided by the host when the handheld device 40 was in the first operational mode includes the multimedia data. The playback of the multimedia data is similar to the playback described with reference to the handheld device 10 of FIG. 1. In this embodiment, depending on the type of multimedia data 34, the rendered output data 36 may be provided to one or more of the multimedia output devices. For example, rendered audio data may be provided to the headphone jack 52 an/or to the speaker 50, while rendered video and/or text data may be provided to the display 48.

The handheld device 40 may also record multimedia data 34 while in the second operational mode. For example, the handheld device 40 may store digital information received via one of the multimedia input devices 44, 46, and 54.

Figure 3:
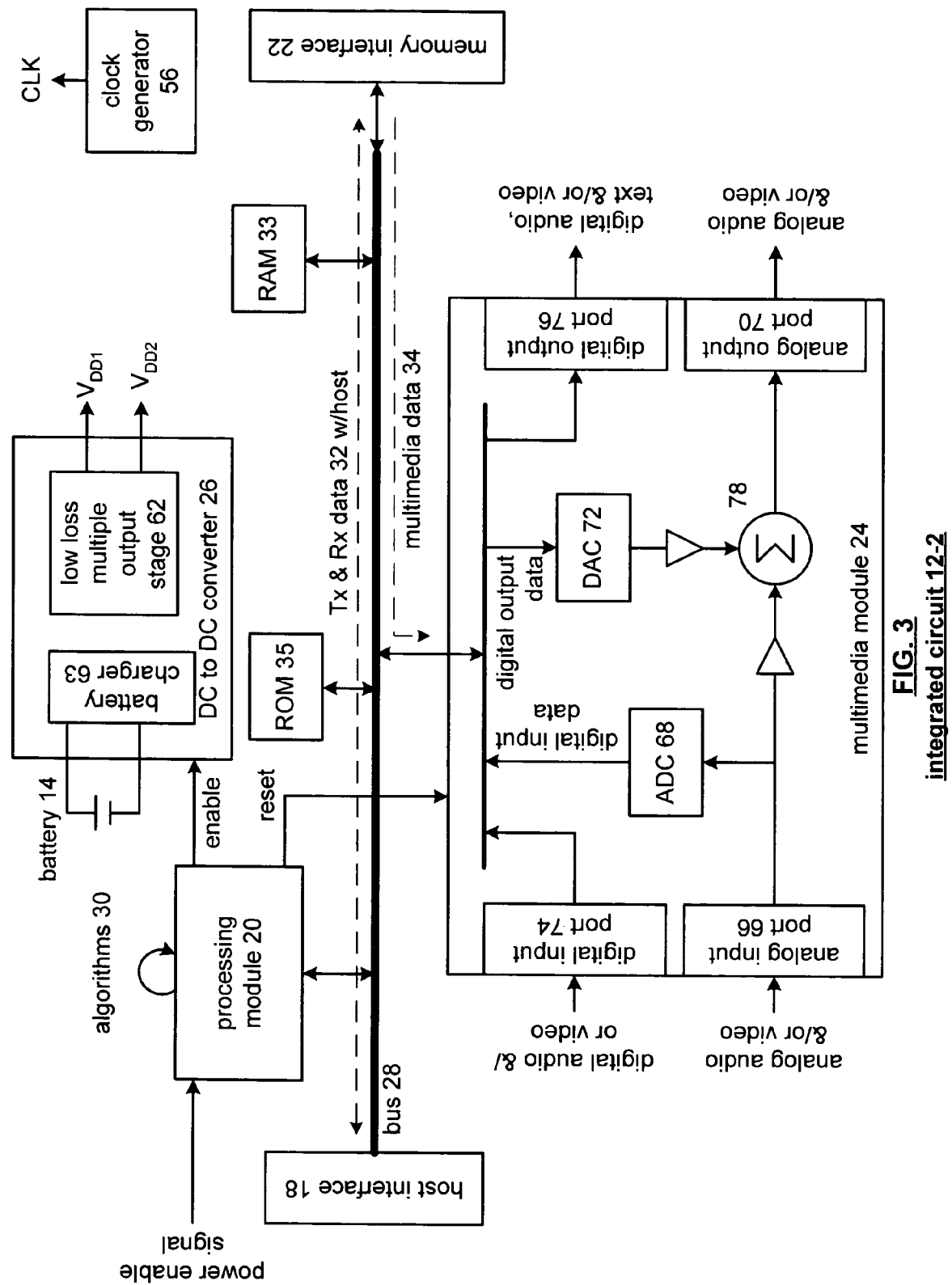
FIG. 3 is a schematic block diagram of another integrated circuit in accordance with the present invention.

FIG. 3 is a schematic block diagram of an integrated circuit 12-2 that may be used in a multi-function handheld device. The integrated circuit 12-2 includes the host interface 18, the processing module 20, the DC-to-DC converter 26, memory 60, the clock generator 56, the memory interface 22, the bus 28 and the multimedia module 24. The DC-to-DC converter 26 includes a first output section 62, and a second output section 64 to produce a first and second output voltage ($V_{DD1}$ and $V_{DD2}$), respectively. Typically, $V_{DD1}$ will be greater that $V_{DD2}$, where $V_{DD1}$ is used to source analog sections of the processing module 20, the host interface 18, the memory interface 22, and/or the multimedia module 22 and $V_{DD2}$ is used to source the digital sections of these modules. The DC-to-DC converter 26 may further include a battery charger 63 and a low loss multiple output stage 62. The battery charger 63 is operable to charge the battery 14 from power it receives via the physical coupling (e.g., via a USB cable) to the host device when the multi-function handheld device is physically coupled to the host device. The particular implementation of the battery charger 63 is dependent on the type of battery being used and such implementations are known in the art, thus no further discussion will be provided regarding the battery charger 63 except to further illustrate the concepts of the present invention.

The multimedia module 24 includes an analog input port 66, an analog to digital converter (ADC) 68, an analog output port 70, a digital to analog converter (DAC) 72, a digital input port 74, a digital output port 76, and an analog mixing module 78. The analog input port 66 is operably coupled to receive analog input signals from one or more sources including a microphone, an AM/FM tuner, a line in connection (e.g., headphone jack of a CD player), etc. The received analog signals are provided to the ADC 68, which produces digital input data therefrom. The digital input data may be in a pulse code modulated (PCM) format and stored as such, or it may be provided to the processing module 20 for further audio processing (e.g., compression, MP3 formatting, etc.) The digital input data, or the processed version thereof, is stored in memory 16 as instructed by the processing module 20.

The digital input port 74 is operably coupled to receive digital audio and/or video input signals from, for example, a digital camera, a camcorder, etc. The digital audio and/or video input signals may be stored in memory 16 under the control of the processing module 20. As one of average skill in the art will appreciate, the audio and/or video data (which was inputted as analog signals or digital signals) may be stored as raw data (i.e., the signals received are stored as is in designated memory locations) or it may be stored as processed data (i.e., compressed data, MPEG data, MP3 data, WMA data, etc.).

The DAC 72 receives multimedia data 34 as digital output data and converts it into analog video and/or audio output data that is provided to the mixing module 78. When the output of the DAC 72 is the only input to the mixing module 78, the mixing module 78 outputs the analog video and/or audio output data to the analog output port 70. The analog output port 70 may be coupled to one or more of the speaker, headphone jack, and a video display. The mixing module 78 may mix analog input signals received via the analog input port 66 with the output of DAC 72 to produce a mixed analog signal that is provided to the analog output port 70. Note that the buffers in series with the inputs of the mixing module 78 may have their gains adjusted and/or muted to enable selection of the signals at various gain settings provided to the mixing module 78 and subsequently outputted via the analog output port 70.

The digital output port 76 is operably coupled to output the digital output data (i.e., the multimedia data 34 in a digital format). The digital output port 76 may be coupled to a digital input of a video display device, another handheld device for direct file transfer, etc.

As one of average skill in the art will appreciate, the multimedia module 24 may include more or less components than the components shown in FIG. 3 or include multiple analog and/or digital input and/or output ports. For example, for a playback mode of digital audio files, the multimedia module 24 may only include the DAC 72 and the analog output port 70 that is coupled to the headphone jack and/or to the speaker. As another example, for recording voice samples (i.e., as a digital dictaphone), the multimedia module 24 may include the analog input port 66 coupled to the microphone and the ADC.

Figure 4:
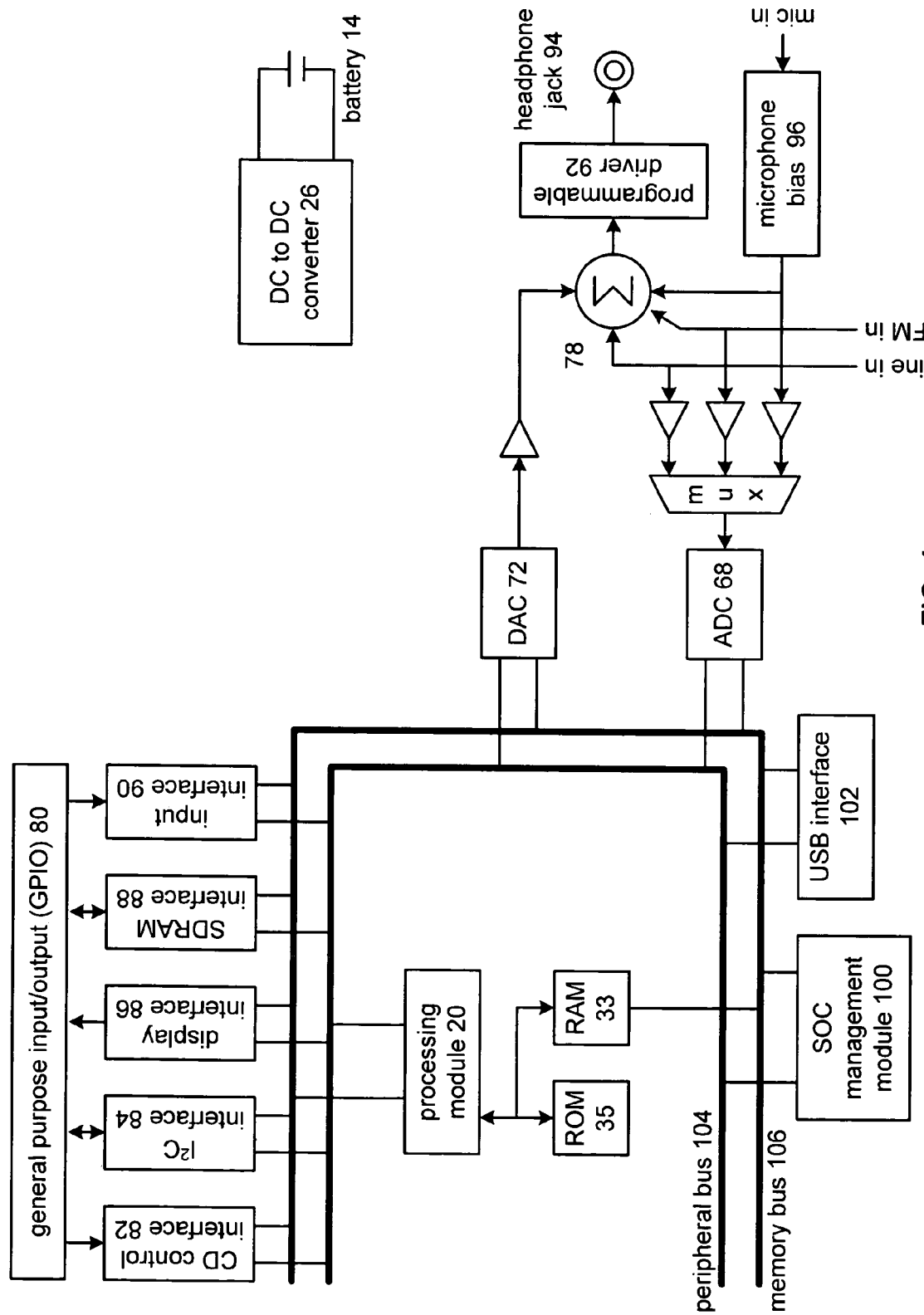
FIG. 4 is a schematic block diagram of yet another integrated circuit in accordance with the present invention.

FIG. 4 is a schematic block diagram of an integrated circuit 12-3 that may be incorporated in a multi-function handheld device 10 or 40. The integrated circuit 12-3 includes a general purpose input/output module 80, a CD control interface 82, an I$^2$C interface module 84, a display interface module 86, a static and/or dynamic RAM interface 88, an input interface module 90, processing module 20, ROM 35, RAM 33, a peripheral bus 104, a memory bus 106, a system-on-a-chip (SOC) management module 100, a universal serial bus (USB) interface 102, a digital-to-analog converter 72, an analog-to-digital converter 68, a multiplexer, buffers, mixing module 78, DC to DC converter 26, a programmable driver 92, and a microphone bias module 96.

In operation, the integrated circuit 12-3 may facilitate the transceiving of data with a host device between system memory of a multi-function handheld device and a host device, may playback multimedia data, and/or may record multimedia data via input ports. When the integrated circuit 12-3 is transceiving with a host device, the USB interface 102 operably couples the integrated circuit 12-3 to a host device. In addition, the SDRAM interface 88 couples, either via the general purpose input/output module 80 or directly, to the system memory (e.g., memory IC 16) of the multi-function handheld device 10. In this configuration, data that is received from the host device is placed on the memory bus 106 by the USB interface 102. The SDRAM interface 88 retrieves the data from the memory bus 106 and forwards it for storage to the system memory under the control of the processing module 20 that is executing a file system storage algorithm. The data being stored may correspond to playback data, such as an MP3 file, a WMA file, a video file, a text file, and/or a combination thereof. Alternatively, or in addition to, the data being received from the host may correspond to programming instructions of an algorithm 30, which may be an MP3 decoder algorithm, a WMA decoder algorithm, a MPEG algorithm, a JPEG algorithm, et cetera.

For providing data from the handheld device 10 to the host device, the SDRAM interface 88 retrieves data from the system memory and places it on the memory bus 106 under the control of the processing module 20 as it executes a file system algorithm. The USB interface 102 retrieves the data from the memory bus 106 and forwards it to the host device in accordance with one of the versions of the USB standard.

Data may also be stored in the system memory that is received via the CD (compact disk) control interface 82, and/or the I$^2$C interface 84 or other type of two or three wire data interface. Via these interfaces 82 and 84, data is received via the general purpose input/output module 80 and placed on the memory bus 106. The SDRAM interface 88 retrieves the data from the memory bus 106 and provides it to the system memory, which is done under the control of the processing module as it executes a data storage algorithm.

When the integrated circuit 12-3 is recording audio inputs received via the microphone input, the microphone bias circuit 96 provides the received audio signals to the mixing module 78 as well as to the multiplexer (mux) via a buffer. The microphone bias circuit 96 biases the audio input for optimal operations. The received audio input signals are is converted to digital audio signals via the analog-to-digital converter 68. The digital audio signals may then be stored in system memory (e.g., memory IC 16). Alternatively, the audio input signal may be provided to the summing module 78 and subsequently provided to headphone jack 94 via the programmable driver 92 as a component of a summed analog signal. The summing module 78 may sum, or pass any one of, the audio input signals may be mixed with other analog input signals, such as a line input, an FM radio input, and the analog output of the DAC 72, to produce the summed signal.

When the integrated circuit 12-3 is in a playback mode, digital multimedia data is retrieved from the system memory and provided to the digital-to-analog converter 72. The digital-to-analog converter 72 converts the digital multimedia signals, which may be audio data, video data and/or text data, into analog multimedia signals and provides the analog multimedia signals to mixing module 78. In the playback mode, the mixing module 78 will generally have the other inputs muted, such that its output corresponds directly to the analog multimedia signals provided by the digital-to-analog converter 72.

The programmable driver 92 increases the drive power of the analog multimedia signals (e.g., audio signals when the analog multimedia signals are provided to a headphone) and provides it to the headphone jack 94. As one of average skill in the art will appreciate, a fixed driver may replace the programmable driver 92 to drive the headphone jack 94.

To place the integrated circuit 12-3 into the various operational modes, commands are received via the general purpose input/output module 80 by the input interface 90. The input interface 90 receives the input stimulus corresponding to commands, interprets the input stimulus to generate the corresponding commands. The commands are then provided on the peripheral bus 104 and/or the memory bus 106 and processed by the processing module 20.

In addition to producing audio outputs during playback mode, the integrated circuit 12-3 may provide video outputs via the display interface 86. The display interface 86 drives the display, which may be an LCD display, LED display, plasma display and/or any other type of display. The data being displayed may correspond to the multimedia data retrieved from the system memory, and/or may correspond to the commands inputted via the input interface 90.

The system-on-a-chip (SOC) management module 100 processes interrupt controls, generates clock signals for the integrated circuit 12-3, performs bit manipulations, performs debugging operations, and executes a Reed-Solomon, or other type of encoding/decoding algorithm to encode and/or decode data.

The DC to DC converter 26 provides at least one supply voltage for the integrated circuit 12-3 and typically provides two supply voltages. For example, the DC to DC converter 26 may produce a 3.3 volts supply and a 1.8 volt supply.

Figure 5:
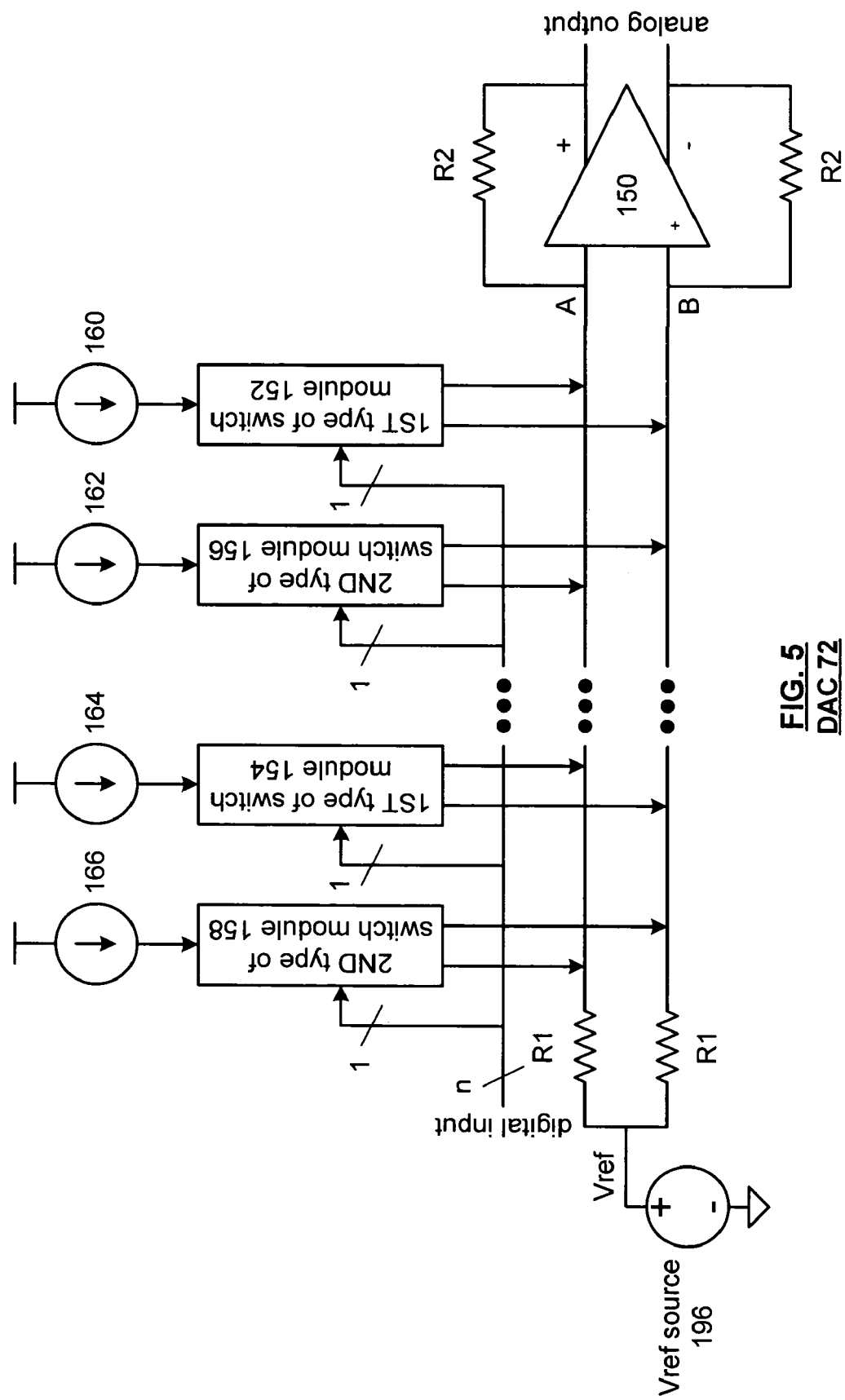
FIG. 5 is a schematic block diagram of a digital to analog converter in accordance with the present invention.

FIG. 5 is a schematic block diagram of the digital-to-analog converter 72. The digital-to-analog converter 72 includes a plurality of current sources 160–166, a plurality of switching modules 152–158, a voltage reference source 196, and a differential amplifier 150 wherein the gain of the differential amplifier 150 is based on the ratio of resisters R1 and R2. As one of average skill in the art will appreciate, the feedback circuitry corresponding to the gain of the operational amplifier 150 may include additional resisters, capacitors, et cetera to establish a desired frequency response.

The switching modules 150–158 include a 1st type of switching module 152 and 154 and a 2nd type of switching module 156 and 158. The switching modules 152–158 are operably coupled to provide currents from its corresponding current source 160–166 to the A and/or B input of the differential amplifier circuit 150. The cumulative amount of current provided to the A input and B input is dependent on a corresponding bit of the digital input. As shown, the digital input may include n-bits where one of the n-bits controls the switching of the corresponding switching modules 152–158. For example, if the digital input includes 4 bits, the most significant bit would be provided to switching module 152, the 2nd most significant bit to switching module 156, the 3rd most significant bit to switching module 154 and the 4th most significant bit to switching module 158. For a more detailed discussion of the DAC refer to patent application entitled METHOD AND APPARATUS FOR ACCURATE DIGITAL-TO-ANALOG CONVERSION, having the same filing date as the present application, and having an attorney docket number of SIG000084.

To produce the analog output, the differential amplifier 150 has a resistive gain network of resistors R1 and R2, which establishes the gain of the differential amplifier 150. As is shown, nodes A and B are operably coupled to a voltage reference source 196, which may be a variable bandgap module as will be discussed with reference to FIG. 6. The variable bandgap module 196 may be set to provide one or more desired voltage references. For example, if the supply voltage for the DAC 72 is 1.8 volts, the voltage reference source 196 may be set to provide a 0.9 voltage reference, which is an optimal setting for differential operation of the operational amplifier 150. As technology evolves and the supply voltage decreases, the voltage reference source 196 may be set to lower and lower voltages that, for differential signaling, splits the supply voltage in half.

Figure 6:
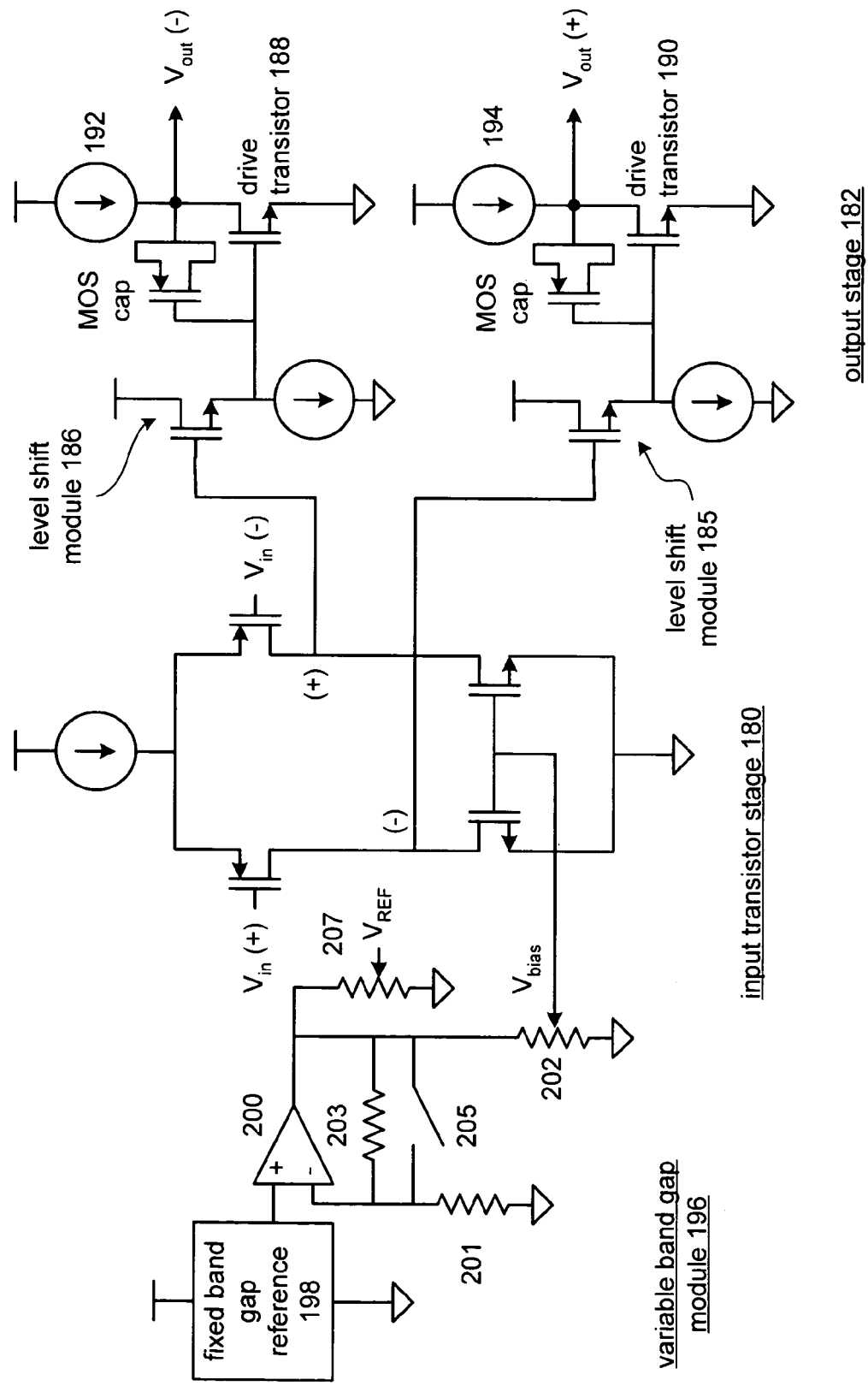
FIG. 6 is a schematic block diagram of a variable bandgap module providing various reference voltages for an operational amplifier of the digital to analog converter of FIG. 5.

FIG. 6 is a schematic block diagram of operational amplifier 150 that may be used in the digital-to-analog converter 72. As one of average skill in the art will appreciate, the operational amplifier 150 has a multitude of uses beyond use in a digital-to-analog converter. The operational amplifier 150 includes an input transistor stage 180 and an output stage 182 and is coupled to a variable band-gap module 196. The variable gap module 196 includes a fixed band-gap reference 198, an amplifier 200, a switch 205, and a plurality of resistors 201, 202, 203, and 207 (which may be fixed and/or variable resistors). In general, the variable band-gap module 196 allows for a lower bias voltage ($V_{bias}$) to be generated than the voltage provided by the fixed bandgap reference 198, to produce a bias voltage greater than the voltage of the fixed bandgap reference 198, and/or to produce another selectable voltage reference ($V_{REF}$). The $V_{bias}$ voltage reference may be used to bias the operational amplifier 150 when it is operated from lower supply voltages.

In operation, the fixed band-gap reference 198 generates a fixed reference voltage (e.g., 0.75 volts to 1.25 volts) from a supply voltage (e.g., 1.8 volts, 3.3 volts, 1.2 volts, et cetera). When switch 205 is closed, the output of the amplifier 200 mimics the fixed voltage reference and provides it to resistors 202 and 207. By tuning the resistor 202, the bias voltage may range from the fixed reference voltage down to near 0 volts. Accordingly, in an operational amplifier, such as the one illustrated in FIG. 6, when the supply voltage is relatively low (e.g., 1.8 volts or less), tuning the bias voltage to equate to approximately ½ of the supply voltage provides better dynamic range for the operational amplifier. Resistor 207 may be varied in a similar manner to that of resistor 202 to produce an adjustable voltage reference.

When switch 205 is open, the amplifier 200 amplifies the fixed voltage reference based on a ratio between resistor 203 and resistor 201, which may be adjustable resistors. As such, the output of the amplifier 200 may be set to a voltage that is above the voltage of the fixed voltage reference. Thus, the bias voltage and the voltage reference may vary from the voltage produced by the amplifier 200 to near zero.

The variable bandgap reference 196 may further include a supply voltage sensing module and an adjustable voltage follower module. The supply voltage sensing module is operably coupled to sense a supply voltage and to generate an adjust setting based on the sensed supply voltage. For example, if the supply voltage is sensed to be 1.8 volts, then the adjust setting may cause the resistors 202 and/or 207 to be set such that the resulting reference voltage and/or bias voltage is set to 0.9 volts. The adjustable voltage follower module is operably coupled to produce the reference voltage from the fixed reference voltage based on the adjust setting. For example, the adjustable voltage follower may include an operational amplifier having a unity gain compensation network and a variable resistance coupled to an output of the operational amplifier, wherein the variable resistance is set based on the divider setting.

As illustrated, the operational amplifier has an input transistor stage 180 and an output transistor stage 182. The input transistor stage 180 includes two P-channel transistors and two N-channel transistors. The N-channel transistors are gated based on the bias voltage where the P-channel transistors receive a differential input signal. The input stage 180 produces a differential output indicated by the + and − signs that is provided to the output stage 182.

The output stage includes, for each leg of the differential signal produced by the input stage, a level shift module 184–186, a drive transistor 188–190, a current source 192–194, and a MOS capacitor (MOS cap). The MOS cap provides feed-forward compensation for the drive transistors 188 and 190 to improve the performance of the output stage 182. In prior art embodiments, the capacitor across the drive transistors were metal capacitors. As is known in the art, the size of a metal capacitor is significantly greater than the size of a MOS cap but the capacitance value of a MOS cap varies as its operating conditions (e.g., as gate-threshold voltage [$V_T$] changes) change, where the capacitance of a metal capacitor is stable with respect to the voltage applied to it. Since the capacitance value of the feedforward capacitor significantly contributes the frequency response of the output stage, a relatively stable capacitance is desired.

To achieve a relatively stable capacitance for a MOS cap in the output stage 182, the output stage includes level shift modules 185 and 186, which bias their respective MOS caps at a greater threshold voltage such that the MOS caps operate in a more linear capacitance range. With the MOS caps operating in a more linear range, the desired feed-forward compensation across the drive transistors 188 and 190 is more predictable. As shown, the level shift modules 184 and 186 include an N-channel transistor and a current source.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a variable bandgap reference that may be used by a digital to analog converter and/or by a plurality of other circuits implemented on an integrated circuit. As one of average skill in the art will appreciate, other embodiments may be derived from the teachings of the present invention without deviating from the scope of the claims.

What is claimed is:

1. A variable bandgap module comprises:
    fixed bandgap reference source to produce a fixed reference voltage; and
    supply voltage dependent voltage adjust module operably coupled to convert the fixed reference voltage into a reference voltage when a ratio between a supply voltage and the reference voltage is not substantially equal to a desired ratio.

2. The variable bandgap module of claim 1, wherein the supply voltage dependent voltage adjust module further comprises:
    supply voltage sensing module operably coupled to sense the supply voltage and the reference voltage, wherein the supply voltage sensing module generates an adjust setting based on the sensed supply voltage and the desired ratio; and
    adjustable voltage follower module operably coupled to produce the reference voltage from the fixed reference voltage based on the adjust setting.

3. The variable bandgap module of claim 2, wherein the adjustable voltage follower module further comprises:
    an operational amplifier having a unity gain compensation network; and
    a variable resistance coupled to an output of the operational amplifier, wherein the variable resistance is set based on the adjust setting.

4. The variable bandgap module of claim 2, wherein the adjustable voltage follower module further comprises:
    an operational amplifier having an adjustable gain compensation network, wherein an output of the operational amplifier produces a voltage greater than the fixed reference voltage; and
    a variable resistance coupled to the output of the operational amplifier, wherein the variable resistance is set based on the adjust setting.

* * * * *